(12) United States Patent
James et al.

(10) Patent No.: US 11,784,643 B2
(45) Date of Patent: Oct. 10, 2023

(54) CAPACITIVE BUTTON INTERFACE ASSEMBLY

(71) Applicant: MICRO MOTION, INC., Boulder, CO (US)

(72) Inventors: Clayton T. James, Longmont, CO (US); Atul Vasant Deshpande, Pune (IN); Howard Irving Sohm, Jr., Longmont, CO (US); Anthony William Pankratz, Arvada, CO (US); Shaun E. Shanahan, Denver, CO (US)

(73) Assignee: MICRO MOTION, INC., Boulder, CO (US)

( * ) Notice: Subject to any disclaimer, the term of this patent is extended or adjusted under 35 U.S.C. 154(b) by 0 days.

(21) Appl. No.: 17/261,690

(22) PCT Filed: Jul. 31, 2018

(86) PCT No.: PCT/US2018/044495
§ 371 (c)(1),
(2) Date: Jan. 20, 2021

(87) PCT Pub. No.: WO2020/027788
PCT Pub. Date: Feb. 6, 2020

(65) Prior Publication Data
US 2021/0281262 A1   Sep. 9, 2021

(51) Int. Cl.
*H03K 17/96* (2006.01)
*H03K 17/975* (2006.01)

(52) U.S. Cl.
CPC ......... *H03K 17/962* (2013.01); *H03K 17/975* (2013.01); *H03K 2217/96076* (2013.01)

(58) Field of Classification Search
CPC ............... H03K 17/962; H03K 17/975; H03K 2217/96076; H05K 7/00; H05K 13/00;
(Continued)

(56) References Cited

U.S. PATENT DOCUMENTS 4,806,908 A * 2/1989 Krupnik ................ G06F 3/0238
200/534
5,419,713 A * 5/1995 Northey .................... H05K 7/12
439/78
(Continued)

FOREIGN PATENT DOCUMENTS

DE 202014101253 U1 5/2014
EP 2665189 A1 * 11/2013 ......... H03K 17/9622
(Continued)

*Primary Examiner* — Anthony R Jimenez
(74) *Attorney, Agent, or Firm* — The Ollila Law Group LLC

(57) ABSTRACT

A capacitive button interface assembly (100) and a method for assembling the same, comprising a housing member (202), an electrode board (204) coupled to the housing member (202), one or more resilient members (212) positioned between the housing member (202) and the electrode board (204), one or more alignment members (216) coupled to the electrode board (204), operable to align the electrode board (204) with respect to the housing member (202), and a cover (804) coupled to the housing member (202) to apply a force on the electrode board (204).

17 Claims, 9 Drawing Sheets

(58) Field of Classification Search
CPC .. H01H 3/00; H01H 3/02; H01H 3/12; H01H 9/00; H01H 9/02; H01H 9/0242; H01H 9/0264; H01H 9/04; H01H 13/00; H01H 13/14; H01H 13/04; H01H 13/10; H01H 13/50; H01H 2009/02; H01H 2009/04; H01H 2009/048; H01H 2013/50; H01H 2013/52; H01H 2027/00; H01H 2201/00; H01H 2201/01; H01H 2223/00; H01H 2223/002; H01H 2233/00; H01H 2233/002; H01H 2233/03; H01H 2235/00; H01H 2235/022; H01H 2235/024; H01H 2235/026; H01H 2235/028; H01H 2239/034
USPC .......................................................... 200/600
See application file for complete search history.

(56) References Cited

U.S. PATENT DOCUMENTS

| | | | | |
|---|---|---|---|---|
| 6,923,658 | B2* | 8/2005 | Cromwell | H05K 3/301 |
| | | | | 439/71 |
| 7,055,160 | B1* | 5/2006 | Tan | G11B 33/027 |
| | | | | 49/386 |
| 7,104,805 | B2* | 9/2006 | Hjort | H01R 12/52 |
| | | | | 439/74 |
| 2007/0103451 | A1 | 5/2007 | Heimann et al. | |
| 2012/0063101 | A1 | 3/2012 | Schwartz et al. | |

FOREIGN PATENT DOCUMENTS

| | | |
|---|---|---|
| JP | 2017195117 A | 10/2017 |
| WO | 2015149324 A1 | 10/2015 |

* cited by examiner

CAPACITIVE BUTTON INTERFACE ASSEMBLY

TECHNICAL FIELD

The embodiments described below relate to touch sensors and, more particularly, to capacitive touch sensors.

BACKGROUND

Industrial applications often require specialized instruments to control processes. One such instrument is a flow meter, which may be used to measure the mass flow rate, density, and other characteristics of materials flowing through a pipeline, including liquids, gases, combined liquids and gases, solids suspended in liquids, liquids including gases and suspended solids, etc. Flow meters may be used to measure a flow rate (i.e., by measuring a mass flow through the flow meter), and may further be used to determine the relative proportions of components in a flow stream. Flow meters may provide telemetry and status through, for example, an interface that is accessible by an operator. Using the data provided by the flow meter, other instruments such as valves and pumps may control the materials flowing through the pipeline.

The flow meter may be employed in a wide range of industrial applications. As a result, the flow meter is often required to meet a wide range of environmental specifications. For example, the flow meter may be required to reliably function in high humidity while being subjected to temperature cycles or corrosive environments. The flow meter might also be required to accept data input from an operator in these environments. To input the data, the operator typically presses buttons on an interface. Due to the environmental conditions, the buttons in prior art interfaces may be prone to performance issues. For example, mechanical buttons may be subjected to corrosion in high humidity environments. Infrared buttons might need calibration routines to operate reliably in both high and low temperature. As a result, the data input through prior art buttons may include errors.

Capacitive touch buttons address some of these issues because they include no articulating elements, and the capacitive touch button electronics are protected from corrosion by a cover. However, in order for capacitive buttons to work properly, they require contact between the cover, which a user's finger makes contact with, and the capacitive button electrodes that detect the presence of the user's finger. In a button assembly with many parts that contribute to the tolerance stack, it may be difficult to ensure that the electrodes are positioned properly against the protective cover after assembly. In addition, the process environment often comprises vibration, which may change the positioning of the electrodes against the capacitive touch button cover. Accordingly, there is a need for a capacitive button interface assembly that is easy and inexpensive to assemble, and provides reliable alignment and contact in a wide range of environmental conditions.

SUMMARY

A capacitive button interface assembly is provided. The capacitive button interface assembly includes a housing member, an electrode board coupled to the housing member, one or more resilient members positioned between the housing member and the electrode board, one or more alignment members coupled to the electrode board, operable to align the electrode board with respect to the housing member, and a cover coupled to the housing member to apply a force on the electrode board.

A method for assembling a capacitive button interface assembly is provided. The method includes providing a housing member, positioning one or more resilient members having a first end and a second end on the housing member at the first end, positioning an electrode board at the second end of the one or more resilient members, aligning the electrode board with respect to the housing member using one or more alignment members, and coupling a cover to the housing member so that the cover comes into contact with the electrode board and applies a force on the electrode board.

ASPECTS

In a further aspect, each respective alignment member of the one or more alignment members may comprise a bolt, and a nut.

In a further aspect, the bolt may include a bolt head that is not in contact with housing member when the cover is coupled to housing member.

In a further aspect, the nut may be press fit into the electrode board.

In a further aspect, the housing member may include one or more alignment member seats.

In a further aspect, the capacitive button interface assembly may further comprise one or more spring caps, each respective spring cap of the one or more spring caps positioned between a respective resilient member of the one or more resilient members and the electrode board.

In a further aspect, the housing member may include one or more resilient member seats.

In a further aspect, the one or more resilient members may be compressed to a first distance when the cover is not coupled to the cover, and the one or more resilient members are compressed to a second distance when the cover is coupled to the cover.

In a further aspect, the capacitive button interface assembly may further comprise a display panel coupled to the housing member.

In a further aspect, the electrode board may be configured to surround a perimeter of the display panel when the electrode board is coupled to the housing member.

In a further aspect, aligning the electrode board with respect to the housing member using one or more alignment members may further comprise inserting a bolt into an aperture in the housing member, and tightening the bolt into a nut positioned in the electrode board.

In a further aspect, the method may further comprise press fitting the nut into the electrode board.

In a further aspect, the bolt head may no longer be in contact with housing member after the cover is coupled to the housing member.

In a further aspect, the method may further comprise placing one or more shims along a lip of the housing member, and upon aligning the electrode board with respect to the housing member using the one or more alignment members, removing the one or more shims.

In a further aspect, the method may further comprise positioning a spring cap on the second end of each respective resilient member of the one or more resilient members board.

In a further aspect, the housing member may include one or more resilient member seats.

In a further aspect, the one or more resilient members may be compressed to a first distance when the cover is not coupled to the cover, and the one or more resilient members may be compressed to a second distance when the cover is coupled to the cover.

In a further aspect, the housing member may further comprise a display panel, and the method may further comprise aligning the electrode board around a perimeter of the display panel.

BRIEF DESCRIPTION OF THE DRAWINGS

The same reference number represents the same element on all drawings. It should be understood that the drawings are not necessarily to scale.

DETAILED DESCRIPTION

FIGS. 1-11 and the following description depict specific examples to teach those skilled in the art how to make and use the best mode of embodiments of a capacitive button interface assembly. For the purpose of teaching inventive principles, some conventional aspects have been simplified or omitted. Those skilled in the art will appreciate variations from these examples that fall within the scope of the present description. Those skilled in the art will appreciate that the features described below may be combined in various ways to form multiple variations of the capacitive touch sensor. As a result, the embodiments described below are not limited to the specific examples described below, but only by the claims and their equivalents.

Figure 1:
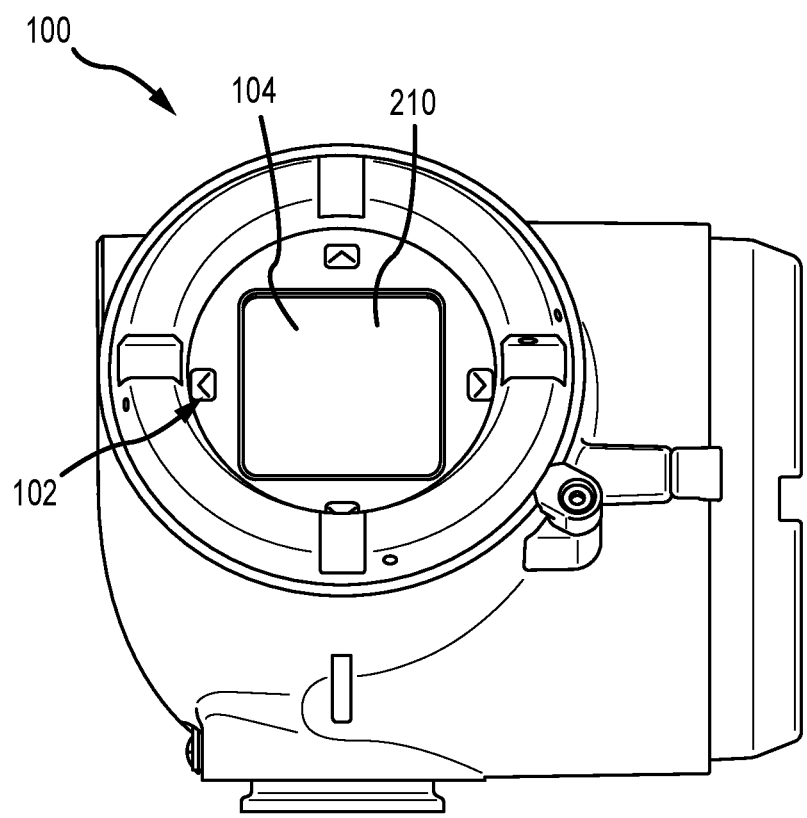
FIG. 1 depicts a front plan view of a capacitive button interface assembly in accordance with an example.

FIG. 1 depicts a front plan view of a capacitive button interface assembly 100. As may be seen, the capacitive button interface assembly 100 includes one or more capacitive touch buttons 102, which are positioned under a cover (not visible in FIG. 1). Capacitive button interface assembly 100 may further include a display panel 104.

The capacitive button interface assembly 100 may allow a user to operate one or more instruments via capacitive touch buttons 102. In examples, capacitive button interface assembly 100 may be used with instruments such as flow meters to monitor processes. The capacitive button interface assembly 100 may be mounted to a wall or a pipe stand and coupled to a flow meter (not shown) to monitor material properties such as flow rates, density, or the like. The capacitive button interface assembly 100 may also be mounted integrally with a flow meter. The capacitive button interface assembly 100 may also be used in a wide range of environmental conditions that include hazardous and uncontrolled environments, such as offshore applications. In addition to receiving data from the flow meter, the capacitive button interface assembly 100 may also receive data input from an operator. To input data into the capacitive button interface assembly 100, the operator presses the capacitive button interface assembly 100 which senses a finger or other object, such as a stylus, through a plate.

Figure 2:
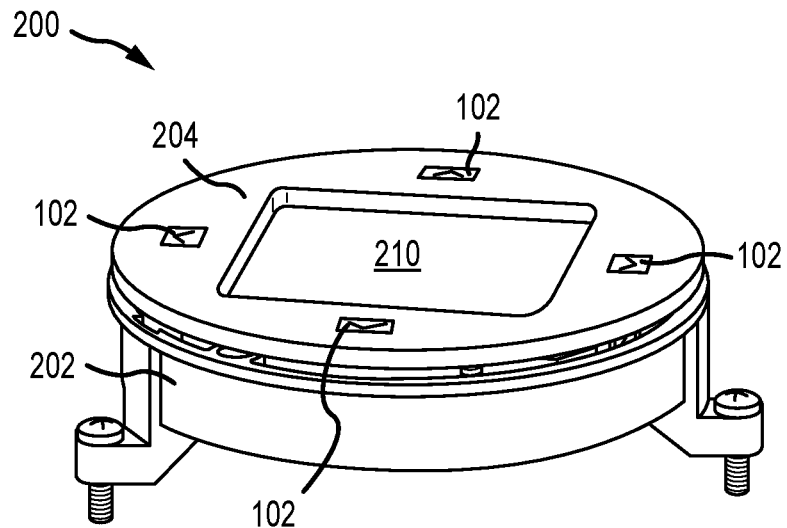
FIG. 2 depicts a perspective view of a housing member and an electrode board in accordance with an example.
Figure 3:
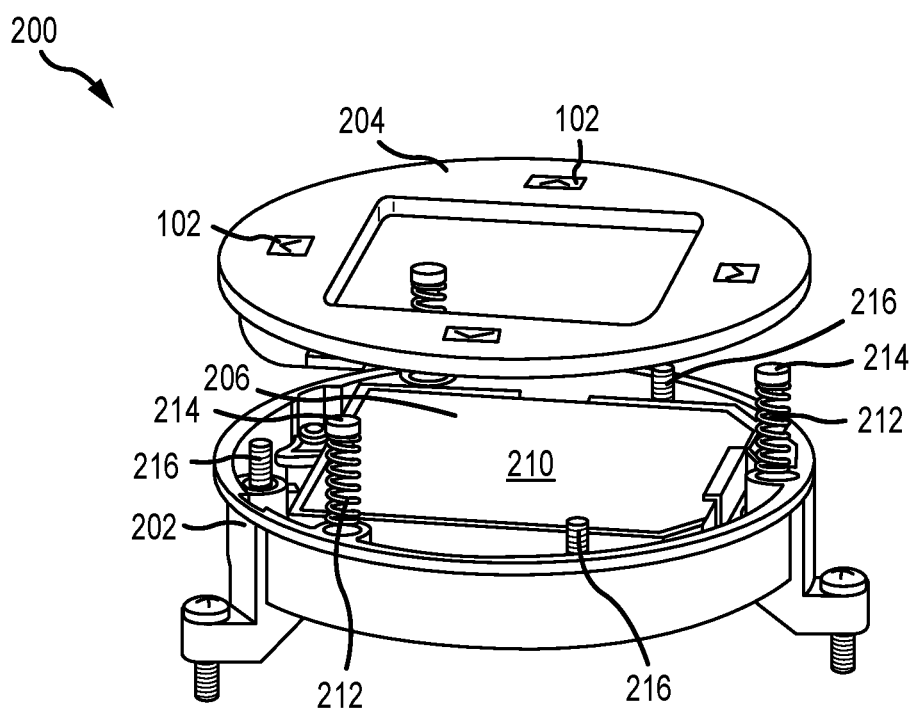
FIG. 3 depicts an exploded perspective view of a housing member and an electrode board in accordance with an example.
Figure 4:
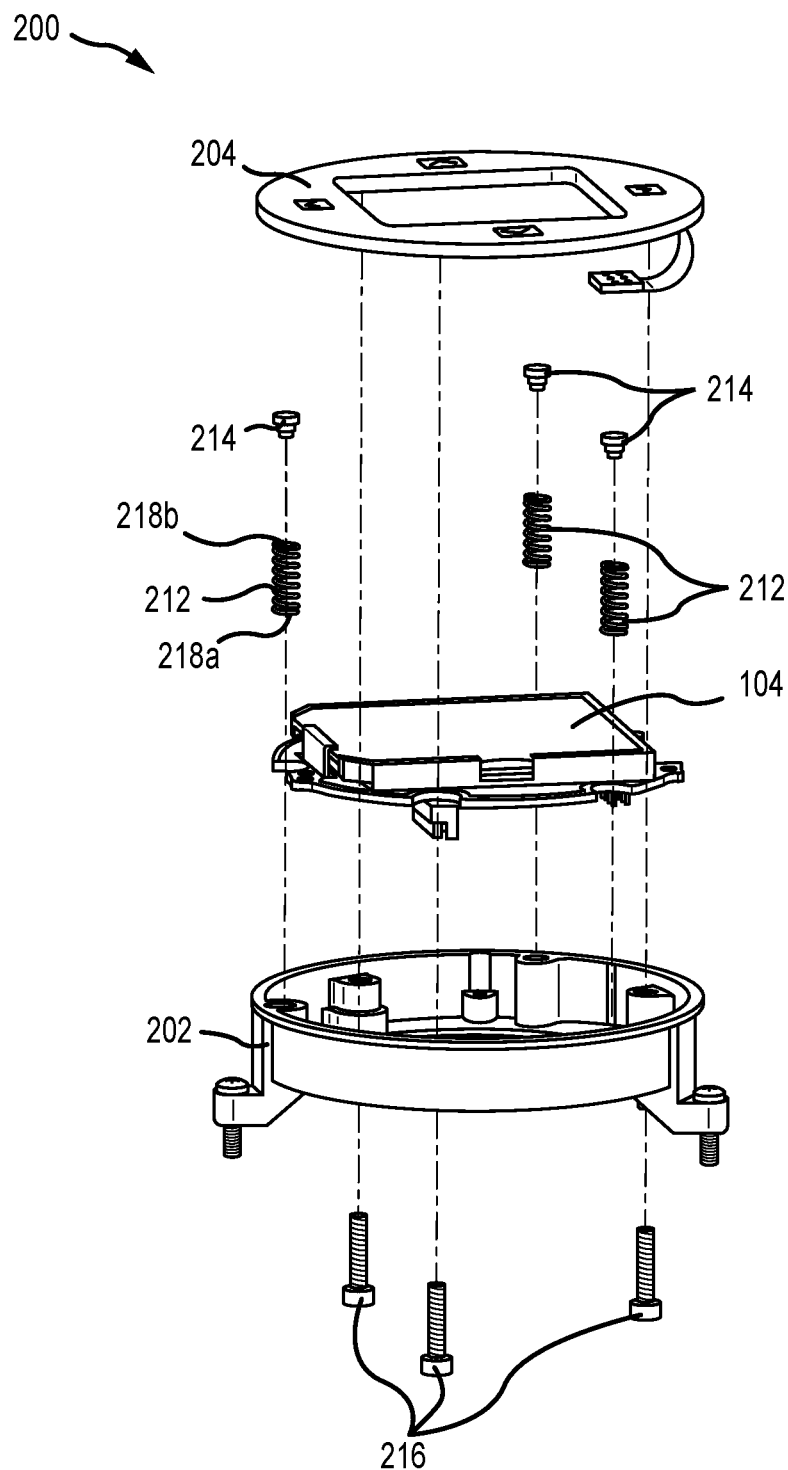
FIG. 4 depicts a further exploded perspective view of a housing member and an electrode board in accordance with an example.
Figure 5:
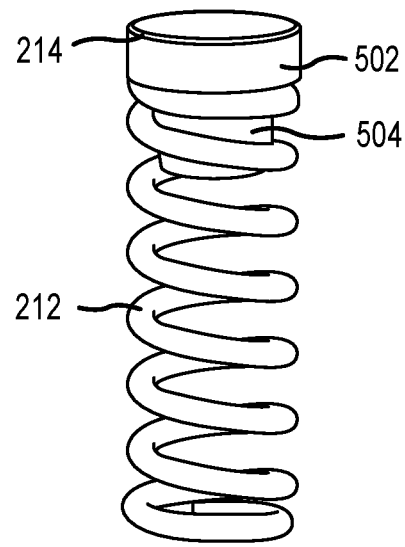
FIG. 5 depicts a spring with spring cap in accordance with an example.
Figure 6:
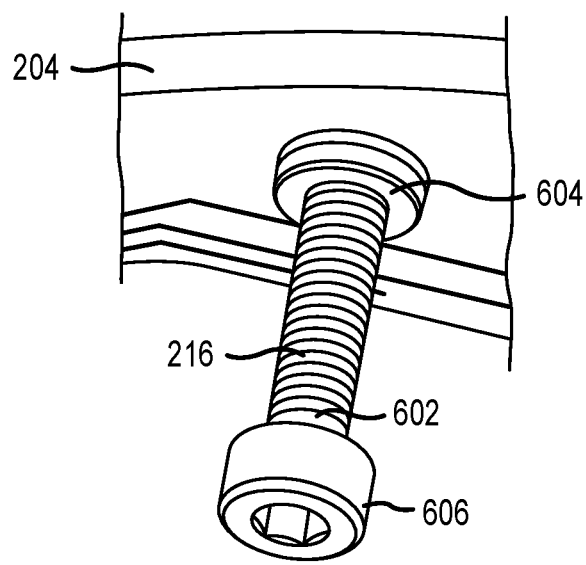
FIG. 6 depicts a bolt with a nut in accordance with an example.
Figure 7:
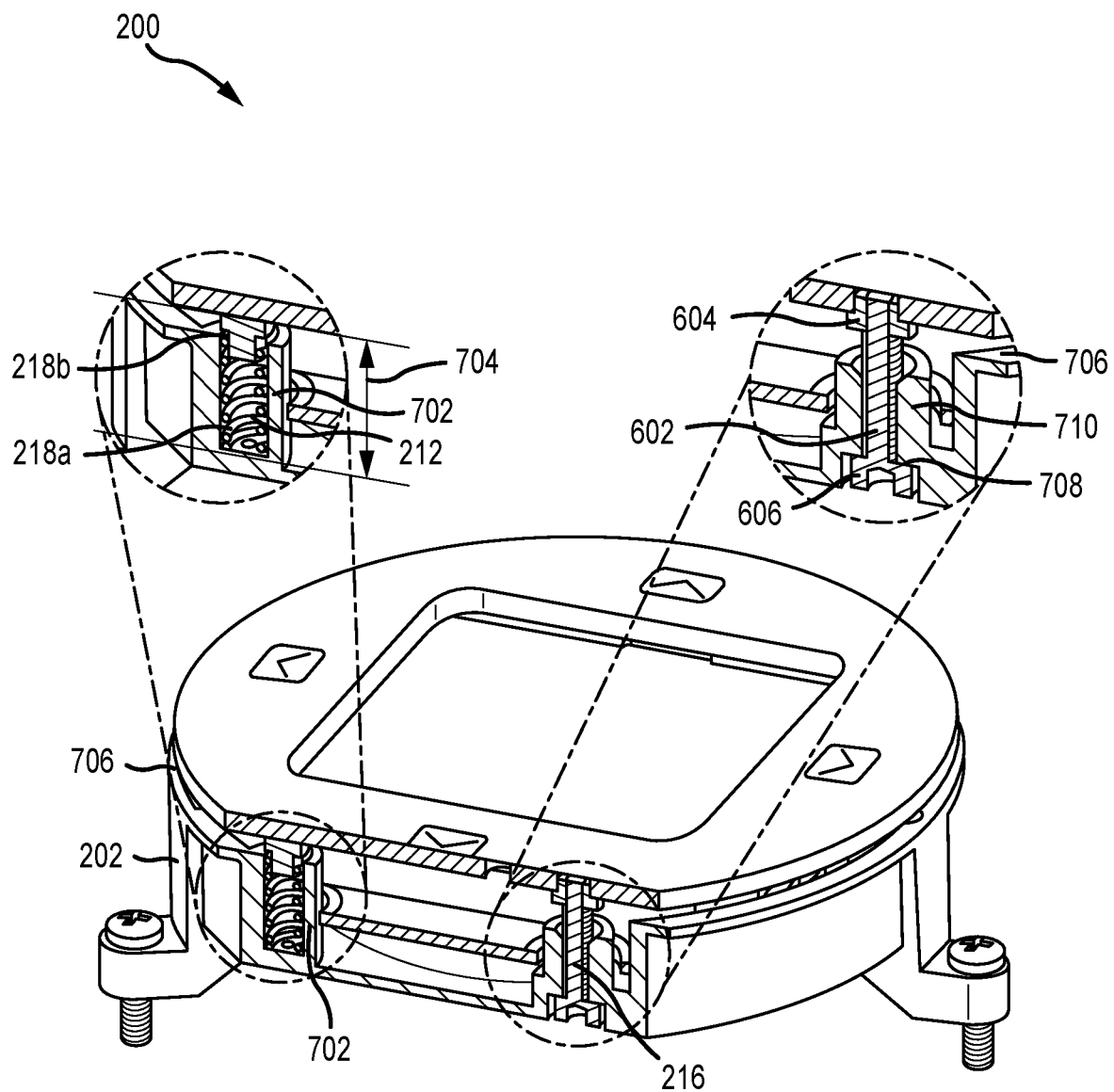
FIG. 7 depicts a perspective cutaway view of the housing member with electrode board in accordance with an example.
Figure 8:
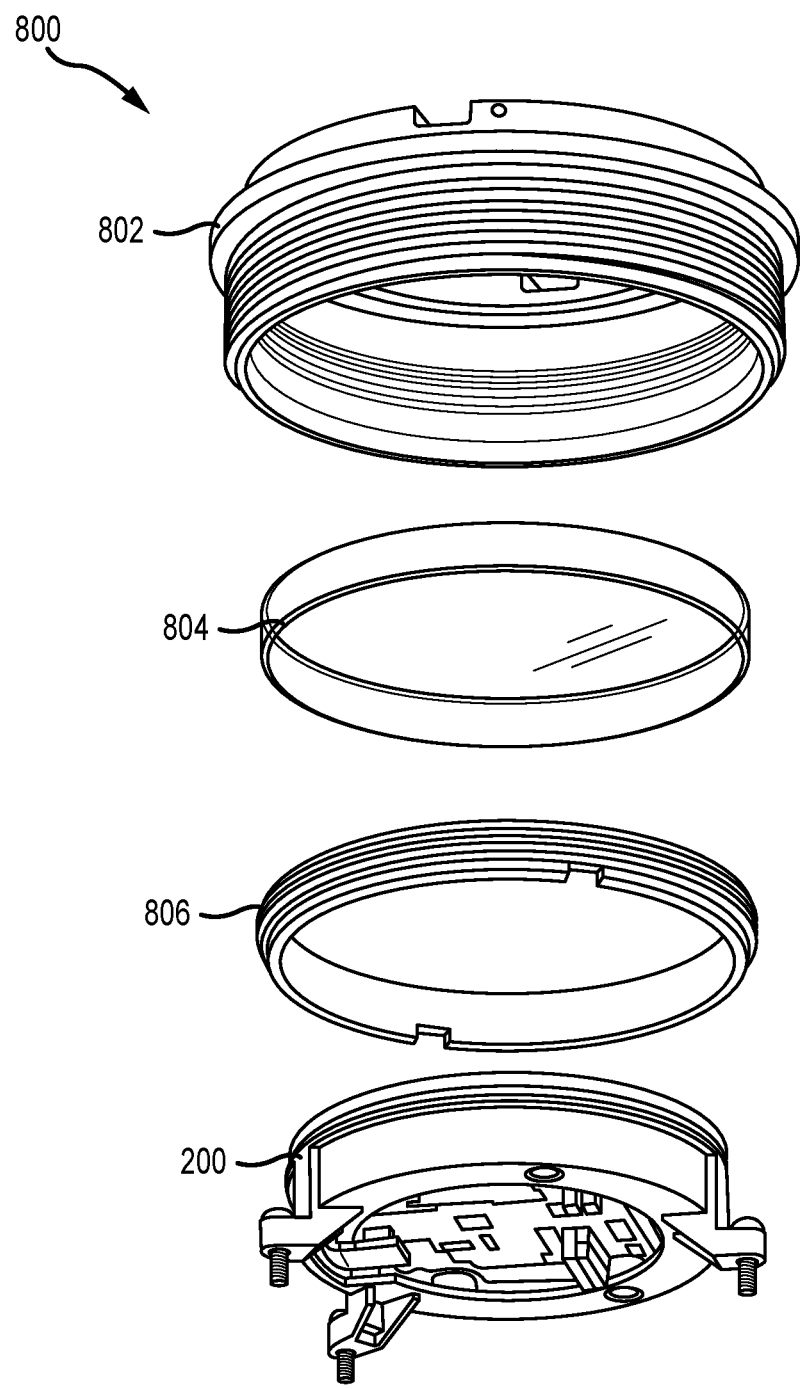
FIG. 8 depicts an exploded perspective view of the capacitive button interface assembly in accordance with an example.
Figure 9:
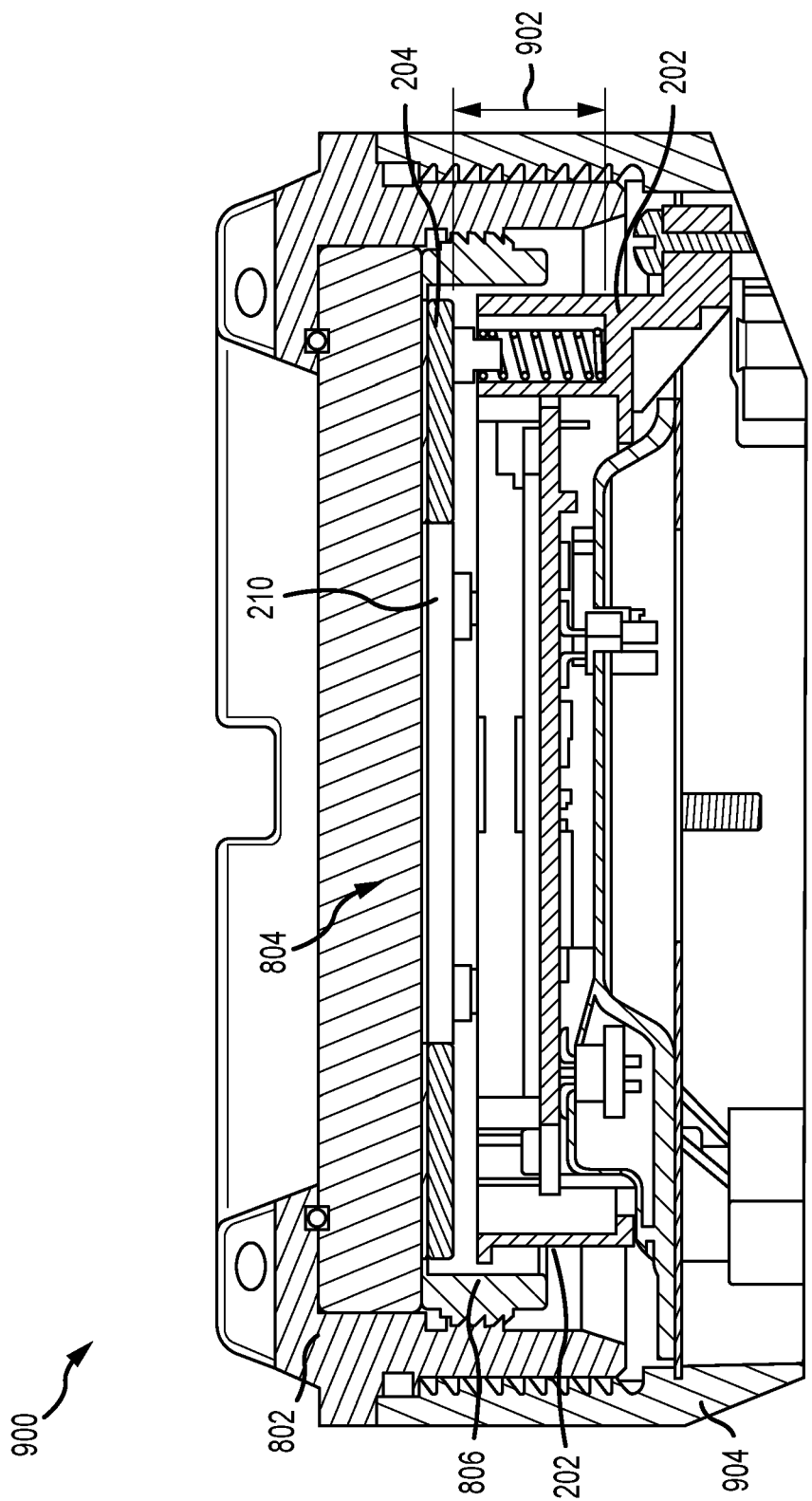
FIG. 9 depicts a cutaway view of the capacitive button interface assembly in accordance with an example.

FIGS. 2-9 depict various components that capacitive button interface assembly 100 may include. FIGS. 2, 3, 4, 7, and 8 depict different views of combined electrode board and housing member assembly 200. In FIGS. 2 and 7, the combined electrode board and housing member assembly 200 are fully assembled. In FIGS. 3 and 4, the combined electrode board and housing member assembly 200 are disassembled. FIG. 5 depicts a detail of resilient member 212, and FIG. 6 depicts a detail of alignment member 216, which, when assembled, are part of the combined electrode board and housing member assembly 200. FIG. 8 depicts an exploded perspective view of cover 804, the combined electrode board and housing member assembly 200, and coupling members 802 and 806. FIG. 9 depicts a cutaway view of the fully assembled capacitive button interface assembly 100.

Housing member 202 covers, protects, or encloses at least a portion of the components of the capacitive button interface assembly 100. FIGS. 2, 3, 4, 7, 8, and 9 provide different perspective views of example housing member 202. As may best be seen in FIGS. 4 and 8, example housing member 202 is bezel-shaped. In further examples, however, other shapes or formats of housing member 202 are possible, as will be understood by those of skill.

Capacitive button interface assembly 100 further includes an electrode board 204 coupled to the housing member 202. Electrode board 204 comprises a substrate with at least one electrode for a capacitive touch button provided on a surface of the substrate. The one or more electrodes positioned on electrode board 204 are coupled to a capacitive touch interface circuit (not depicted). FIGS. 2, 3, 4, 8, and 9 provide different perspective views of the electrode board. The example electrode board 204 is depicted including four electrodes to form four capacitive touch buttons 102, however this is not intended to be limiting. In examples, electrode board 204 may comprise any number of electrodes.

The capacitive button interface assembly 100 further comprises the one or more resilient members 212 positioned between the housing member 202 and the electrode board 204. In the example, the one or more resilient members 212 comprise three coil springs. However, in further examples, the resilient member may comprise any number or type of mechanical spring known to those of skill. FIGS. 3, 4, 5, 7, and 9 provide different perspective views of the one or more resilient members 212.

The capacitive button interface assembly 100 further includes the one or more alignment members 216 coupled to the electrode board 204. The one or more alignment members 216 are operable to align the electrode board 204 with respect to the housing member 202. In the example depicted, the one or more alignment members 216 comprise a bolt 602 and a nut 604. FIG. 6 provides a detail of an alignment member, and FIGS. 3, 4, 7, and 9 provide different perspective views of the one or more alignment members within the capacitive button interface assembly 100.

In examples, nut 604 may be press-fit into electrode board 204, as depicted in FIG. 7.

The one or more alignment members 216 may help align the electrode board 204 with respect to the housing member 202. In examples, alignment members 216 may provide alignment to electrode board 204 in a direction parallel to electrode board 204. In further examples, however, alignment members 216 may provide alignment in a direction perpendicular to electrode board 204.

When the electrode board 204 and housing member 202 assembly is assembled, as depicted in FIGS. 2, 7, 8, and 9, the one or more resilient members 212 are positioned between the housing member 202 and the electrode board 204. The one or more alignment members 216, which are also positioned at least in part between the housing member 202 and the electrode board 204, align the electrode board 204 with respect to housing member 202, and, in some examples, couple the electrode board 204 to the housing member 202.

Capacitive button interface assembly 100 further includes a cover 804 coupled to the housing member. The cover 804 may comprise any dielectric material, including but not limited to glass, plastic, or acrylic. When the cover 804 is assembled within the capacitive button interface assembly 100, the cover 804 applies a force on the electrode board towards the resilient members 212.

After coupling the electrode board 204 to the housing member 202 using the one or more alignment members 216, but before installing the cover 804, the one or more resilient members 212 may be fully extended or partially compressed to a first distance 704, depicted in FIG. 7. In examples, the one or more resilient members 212 may be compressed to a second distance 902, depicted in FIG. 9, when the cover 804 is coupled to the housing member 202. In examples, the second distance 902 may be shorter than the first distance 704. The resilient members 212 may therefore apply a force to the electrode board 204, pressing it against the cover 804 to provide adequate contact.

In examples, the first distance 704 from the electrode board 204 to the housing member 202 may be set to a pre-determined dimension through the use of a special fixture, such as a shim, during manufacturing of the housing member. The first distance 704 may allow the capacitive button interface assembly 100 to accommodate a reasonable variation in tolerance from all of the components of the stack to ensure that the electrode board 204 is always in contact with the underside of the glass at time of final assembly. In this way, it may be possible to maintain contact between the electrode board 204 and the cover 804, providing for a reliable capacitive touch button.

In examples, the bolt 602 may include a bolt head 606 that is no longer in contact with the housing member 202 when the cover 804 is coupled to housing member 202. By allowing the bolt head 606 to be displaced from housing member 202 when the cover 804 is installed on the capacitive button interface assembly 100, this may allow the electrode board 204 to move closer to the housing member 202, accommodating a variation in tolerances while keeping contact between the electrode board 204 and the cover 804.

In examples, the capacitive button interface assembly 100 may further comprise a display panel 104. In examples, display panel 104 may comprise a light-emitting diode display, a plasma display panel, a liquid crystal display, a cathode ray tube display, an electroluminescent display, an electronic paper display, or any other display type known in the art. Display panel 104 may be used by a user to receive telemetry and status from an instrument, or to navigate a command interface.

In examples including the display panel 104, the electrode board 204 may further be configured to surround a perimeter of the display panel when the electrode board 204 is coupled to the housing member 202. This may allow the display to be flush with the button in one seamless interface.

In examples, the capacitive button interface assembly 100 may further include one or more spring caps 214, each respective spring cap of the one or more spring caps 214 positioned between a respective resilient member 212 of the one or more resilient members 212 and the electrode board 204. A detail of an example spring cap 214 is provided in FIG. 5. In examples, the one or more spring caps 214 may include a protector portion 502 and a coupling portion 504. The coupling portion 504 may help couple or align the spring cap 214 to the resilient member 212. The protector portion 502 may help avoid abrasion between the one or more resilient members 212 and the electrode board 204 after assembly when the capacitive button interface assembly 100 experiences vibrations due to instrument or environmental noise. In examples, one or more spring caps 214 may comprise plastic, an elastomer material, or any other material known to those with skill.

In examples, the housing member 202 may further include one or more resilient member seats 702. For example, FIG. 7 depicts a cutaway and detail of a resilient member seat 702. Example resilient member seat 702 comprises a cylinder coupled to housing member 202. Other formats of resilient member seat 702 are possible, however, as will be understood by those of skill.

In examples, the housing member may further include one or more alignment member seats 708. The one or more alignment member seats 708 may make assembly of capacitive button interface assembly 100 easier, because they may provide for positioning and alignment of the one or more alignment members 216 before coupling the electrode board 204 to housing member 202.

In the example provided in the figures, a detail of which is provided in FIG. 7, the alignment member seat 708 is an inset aperture in the base of the housing member 202. The aperture is sized to be large enough to allow a shaft of the bolt 602 to pass, but small enough to provide a lip for the bolt head 606 to rest upon. The inset allows the bolt head 606 to be flush with a bottom surface of housing member 202. Other alignment member seat formats are possible, however, as will understood by those of skill.

In examples, the alignment member seat 708 may further comprise a cylinder 710 coupled to housing member 202. The cylinder 710 may keep the bolt 602 aligned during assembly, and may be sized with a height that is under the lip 706 of the housing member 202. This may allow clearance for the nut 604 in the case where the second distance 902 is less than the first distance 704. In examples, the difference in height between the lip 706 and the top of the cylinder 710 may be greater than or equal to the height of the portion of the nut 604 positioned outside the electrode board 204.

Figure 10:
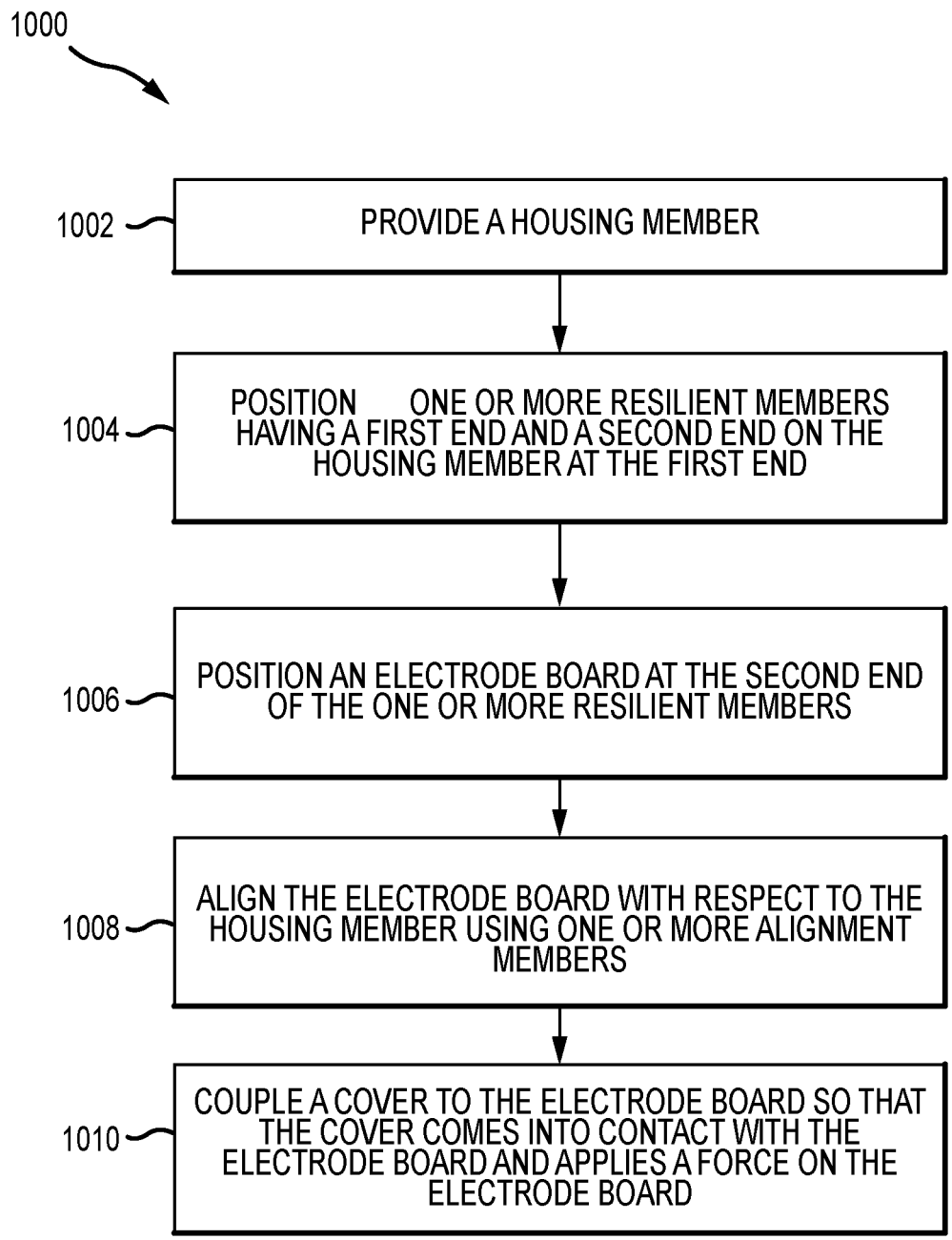
FIG. 10 depicts method 1000 in accordance with an example.

FIG. 10 depicts method 1000, in accordance with an example. Method 1000 may be used to assemble a capacitive button interface assembly 100.

Method 1000 begins with step 1002. In step 1002, a housing member 202 is provided. In examples, housing member 202 may be formed of plastic, metal, or any other material known in the art. Housing member 202 may be machined, cast, injection-molded, or formed via any method known to those of skill.

Method 1000 continues with step 1004. In step 1004, one or more resilient members 212 having a first end 218a and a second end 218b are positioned on the housing member 202 at the first end 218a, as may be seen in a detail of FIG. 7.

For example, FIG. 4 depicts an exploded view of combined electrode board and housing member assembly 200. It may be seen that resilient member 212 has a second end 218b in the direction of the electrode board 204, and a first end 218a in the direction of the housing member 202. This arrangement may also be seen in a detail of FIG. 7.

Method 1000 continues with step 1006. In step 1006, an electrode board is positioned at the second end 218b of the one or more resilient members.

Method 1000 continues with step 1008. In step 1008, the electrode board 204 is aligned with respect to the housing member 202 using one or more alignment members 216. For example, as seen in FIG. 7, bolt 602 has been threaded into an alignment member seat 708 in housing member 202, and coupled to the nut 604, which is press-fit into the electrode board 204.

Method 1000 continues with step 1010. In step 1010, a cover 804 is coupled to the housing member 202 so that the cover 804 comes into contact with the electrode board 204 and applies a force to the electrode board 204.

In examples, the cover 804 may first be attached to a first coupling member 802 using a second coupling member 806. For example, FIG. 8 depicts an unassembled view of coupling members 802 and 806, the cover 804, and the combined electrode board and housing member assembly 200, and FIG. 9 depicts a cutaway view of the same assembled. Example coupling members 802 and 806 are annular and threaded. The cover 804 may be inserted into first coupling member 802, and second coupling member 806 may be threaded into first coupling member 802 to secure the cover 804 within the coupling members.

In examples, the combined electrode board and housing member assembly 200 may be positioned in an instrument housing 904, as may be seen in FIG. 9. The combined cover 804 and coupling member 802, 806 assembly may then be coupled to the instrument housing 904 by turning the threads of first coupling member 802 into the threads of instrument housing 904. It may therefore be possible to move the cover 804 towards electrode board 204 in the stack, applying pressure against electrode board 204. This may shorten the length of the one or more resilient members 212 from the first distance 704 to the second distance 902, and ensure robust contact between the electrode board 204 and the cover 804.

Figure 11:
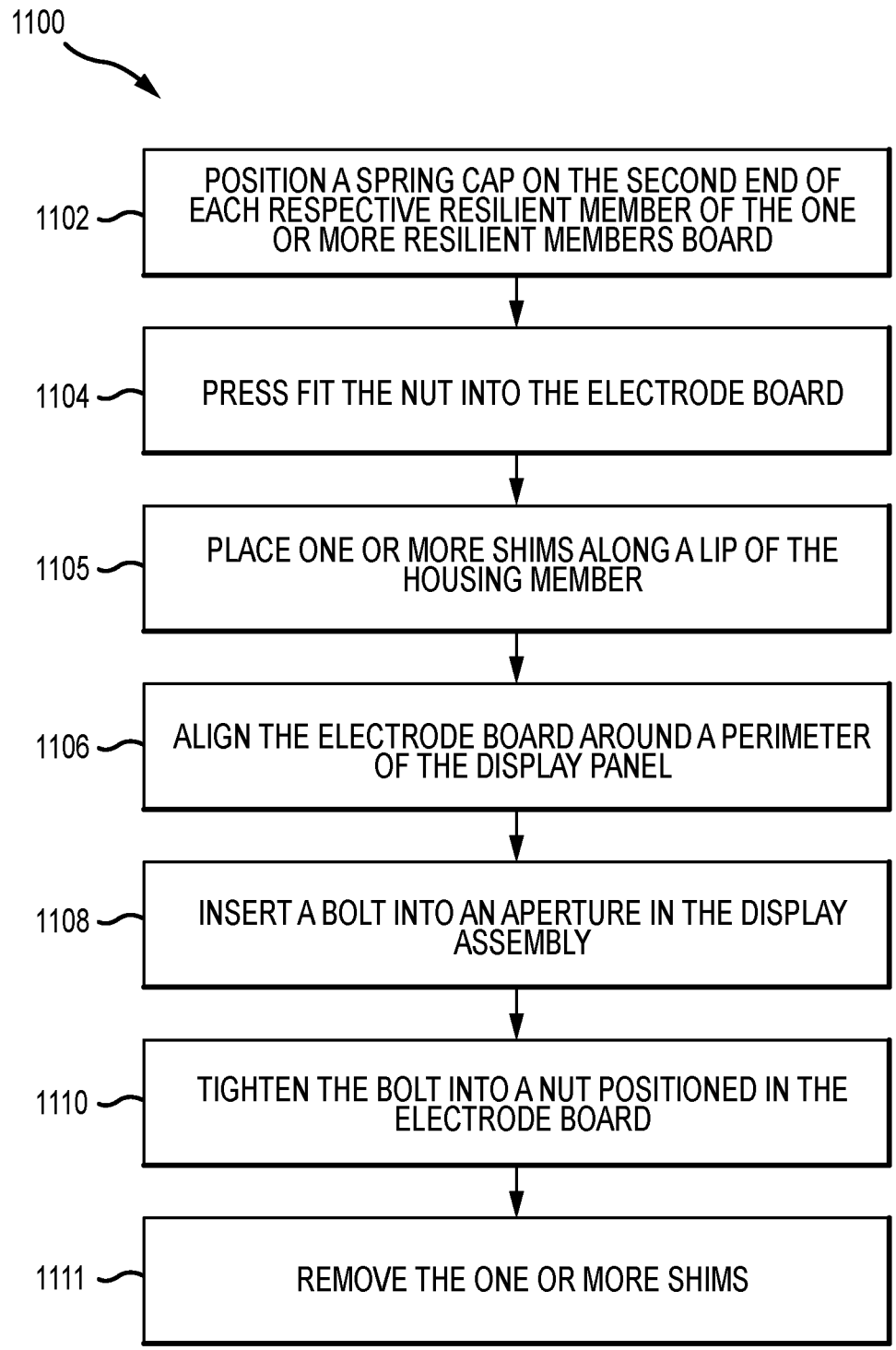
FIG. 11 depicts method 1100 in accordance with an example.

In examples, method 1000 may further include any of the steps of method 1100, depicted in FIG. 11. For example, method 1000 may include step 1101. In step 1102, a spring cap 214 may be positioned on the second end 218b of each respective resilient member 212 of the one or more resilient members 212. For example, as may be seen in FIGS. 3, 5, 7, and 9, spring cap 214 is positioned at an end of resilient member 212.

Method 1000 may further include step 1104. In step 1104, the nut 604 may be press fit into the electrode board 204. For example, as may be seen in FIGS. 6 and 7, nut 604 is press fit into electrode board 204.

In examples, method 1000 may include steps 1105 and 1111. In step 1105, one or more shims may be placed along a lip 706 of the housing member. For example, the one or more shims (not pictured) may be positioned before step 1008 to help maintain a pre-determined first distance 704 from the electrode board 204 to the surface of the housing member 202.

In step 1111, the one or more shims may be removed. For example, the one or more shims may be removed after step 1008. The first distance 704 maintained by the combined electrode board and housing member assembly 200 may help allow for the capacitive button interface assembly 100 to accommodate a reasonable variation of tolerance from all of the contributing components, ensuring that the electrode board 204 stays in contact with the underside of the cover 804.

Method 1000 may further include step 1106. In step 1106, the electrode board 204 may be aligned around a perimeter of a display panel 104. For example, FIGS. 2 and 9 depict a perspective and cross-sectional view of electrode board 204 and display panel 104, respectively.

In examples, step 1008 may further comprise steps 1108 and 1110. In step 1108, a bolt may be threaded into an aperture in the housing member. In step 1110, the bolt may be tightened into a nut positioned in the electrode board.

In examples, method 1000 may provide that the one or more resilient members 212 may be compressed to a first distance 704 when the cover 804 is not coupled to the electrode board 204, and the one or more resilient members 212 are compressed to a second distance 902 when the cover 804 is coupled to the electrode board 204. In examples, first distance 704 is greater than second distance 902. For example, FIG. 7 depicts combined electrode board and housing member assembly 200 without cover 804. First distance 704 includes at least a distance between a portion of housing member 202 in contact with the resilient member 212 and a lip 706 of housing member 202, in addition to a pre-determined distance between a lip 706 of housing member 202 and electrode board 204. FIG. 9 depicts fully assembled capacitive button interface assembly 100 and second distance 902.

By compressing the one or more resilient members 212 from the first distance 704 to the second distance 902 upon installation of the cover 804, it may be possible to accommodate for a large amount of tolerance in the components of the capacitive button interface assembly 100, ensuring that electrode board 204 remains in contact with cover 804 after assembly, in challenging process conditions.

In examples, method 1000 may provide that the bolt head 606 of bolt 602 is no longer in contact with housing member 202 after the cover 804 is coupled to the housing member 202. This may allow bolt 602 and one or more alignment members 216 to preserve a first distance 704 spacing before the cover 804 is assembled, and to provide whatever second distance 902 spacing needed to provide reliable contact between electrode board 204 and cover 804 after the cover 804 is installed.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein may be applied to other touch sensors, and not just to the embodiments described above and shown in the accompanying figures. Accordingly, the scope of the embodiments described above should be determined from the following claims.

We claim:

1. A capacitive button interface assembly, comprising:
a housing member;
an electrode board coupled to the housing member;
one or more resilient members positioned between the housing member and the electrode board;
one or more alignment members coupled to the electrode board, operable to align the electrode board with respect to the housing member;
a cover coupled to the housing member and coupled to the electrode board to apply a force on the electrode board; and
one or more spring caps, each respective spring cap of the one or more spring caps positioned between a respective resilient member of the one or more resilient members and the electrode board.

2. The capacitive button interface assembly of claim 1, wherein the housing member includes one or more alignment member seats.

3. The capacitive button interface assembly of claim 1, wherein the housing member includes one or more resilient member seats.

4. The capacitive button interface assembly of claim 1, wherein the one or more resilient members are compressed to a first distance when the cover is not coupled to the cover, and the one or more resilient members are compressed to a second distance when the cover is coupled to the cover.

5. The capacitive button interface assembly of claim 1, wherein each respective alignment member of the one or more alignment members comprises:
a bolt; and
a nut.

6. The capacitive button interface assembly of claim 5, wherein the bolt includes a bolt head that is not in contact with housing member when the cover is coupled to housing member.

7. The capacitive button interface assembly of claim 5, wherein
the nut is press fit into the electrode board.

8. The capacitive button interface assembly of claim 1, further comprising:
a display panel coupled to the housing member.

9. The capacitive button interface assembly of claim 8, wherein the electrode board is configured to surround a perimeter of the display panel when the electrode board is coupled to the housing member.

10. A method for assembling a capacitive button interface assembly, the method comprising:
providing a housing member;
positioning one or more resilient members having a first end and a second end on the housing member at the first end;
positioning an electrode board at the second end of the one or more resilient members;
aligning the electrode board with respect to the housing member using one or more alignment members;
coupling a cover to the housing member so that the cover comes into contact with the electrode board and applies a force on the electrode board; and
positioning a spring cap on the second end of each respective resilient member of the one or more resilient members, the spring cap being positioned between the each respective resilient member of the one or more resilient members and the electrode board.

11. The method for assembling the capacitive button interface assembly as claimed in claim 10, wherein the housing member includes one or more resilient member seats.

12. The method for assembling the capacitive button interface assembly as claimed in claim 10, wherein the one or more resilient members are compressed to a first distance when the cover is not coupled to the cover, and the one or more resilient members are compressed to a second distance when the cover is coupled to the cover.

13. The method for assembling the capacitive button interface assembly as claimed in claim 10, wherein the housing member further comprises a display panel, and the method further comprises:
aligning the electrode board around a perimeter of the display panel.

14. The method for assembling the capacitive interface assembly as claimed in claim 10, further comprising:
placing one or more shims along a lip of the housing member; and
upon aligning the electrode board with respect to the housing member using the one or more alignment members removing the one or more shims.

15. The method for assembling the capacitive button interface assembly of claim 10, wherein aligning the electrode board with respect to the housing member using one or more alignment members further comprises:
inserting a bolt into an aperture in the housing member; and
tightening the bolt into a nut positioned in the electrode board.

16. The method for assembling the capacitive button interface assembly as claimed in claim 15, further comprising:
press fitting the nut into the electrode board.

17. The method for assembling the capacitive button interface assembly as claimed in claim 15, wherein a bolt head is no longer in contact with the housing member after the cover is coupled to the housing member.

* * * * *